United States Patent [19]
Koshikawa

[11] Patent Number: 5,579,267
[45] Date of Patent: Nov. 26, 1996

[54] SEMICONDUCTOR PIPELINE MEMORY DEVICE ELIMINATING TIME LOSS DUE TO DIFFERENCE BETWEEN PIPELINE STAGES FROM DATA ACCESS

[75] Inventor: Yasuji Koshikawa, Tokyo, Japan

[73] Assignee: NEC Corporation, Tokyo, Japan

[21] Appl. No.: 534,208

[22] Filed: Sep. 26, 1995

[30] Foreign Application Priority Data

Sep. 28, 1994 [JP] Japan .................... 6-232732

[51] Int. Cl.$^6$ .................... G11C 7/00; G11C 8/00
[52] U.S. Cl. ............. 365/189.05; 365/194; 365/230.07; 365/233
[58] Field of Search .............. 365/189.05, 194, 365/230.07, 233

[56] References Cited

U.S. PATENT DOCUMENTS 5,471,607 11/1995 Garde ..................... 365/233

FOREIGN PATENT DOCUMENTS 61-148692 7/1986 Japan .
676566 3/1994 Japan .

Primary Examiner—David C. Nelms
Assistant Examiner—Trong Phan
Attorney, Agent, or Firm—Sughrue, Mion, Zinn, Macpeak & Seas

[57] ABSTRACT

A semiconductor pipeline memory device has a controller for producing first, second and third timing clock signals for transferring a column address and a read-out data bit through first, second and third pipeline stages to an input-and-output pin, and long time interval between two of the first, second and third timing clock signals and short time interval between another two of the first, second and third timing clock signals are respectively assigned to one of the first to third pipeline stages with relatively long signal path and another of the first to third pipeline stages with relatively short signal path, thereby decreasing undesirable time loss.

11 Claims, 10 Drawing Sheets

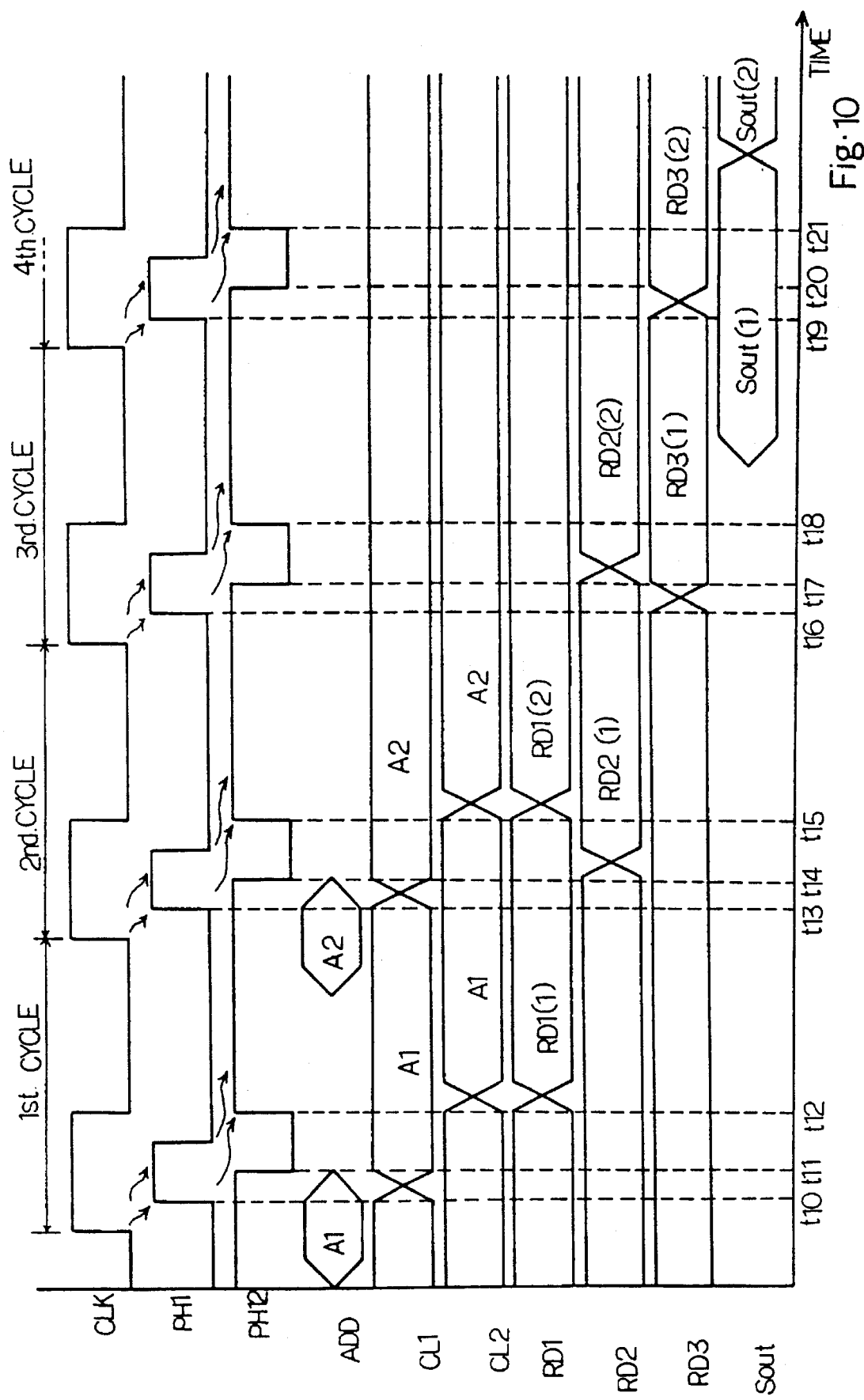

5,579,267

1

SEMICONDUCTOR PIPELINE MEMORY DEVICE ELIMINATING TIME LOSS DUE TO DIFFERENCE BETWEEN PIPELINE STAGES FROM DATA ACCESS

FIELD OF THE INVENTION

This invention relates to a semiconductor pipeline memory device and, more particularly, to a semiconductor pipeline memory device eliminating time loss due to a difference in signal propagation paths between pipeline stages.

DESCRIPTION OF THE RELATED ART

The semiconductor memory device usually assists a microprocessor, and provides a data storage for it. The microprocessor has enhanced the calculation speed, and, accordingly, the semiconductor memory device is expected to increase the access speed. However, the process technologies presently available and a large semiconductor chip for an ultra large scale integration set limit on the access speed, and the semiconductor memory device can not satisfy a system designer.

One of the approaches for the speed-up is a pipeline structure, and several semiconductor pipeline memory devices have been proposed. Japanese Patent Publication of Unexamined Applications Nos. 61-148692 and 6-76566 disclose typical examples of the semiconductor pipeline memory device.

FIG. 1 illustrates a typical example of the semiconductor pipeline memory device fabricated on a semiconductor chip 1. The prior art semiconductor pipeline memory device comprises a memory cell array 2 implemented by a plurality of addressable memory cells and sense amplifier circuits 3 connected through bit line pairs 4 to the memory cell array 2. The bit line pairs 4 are selectively connected to the addressable memory cells, and propagate read-out data bits and write-in data bits between the sense amplifier circuits 3 and the memory cell array 2.

The prior art semiconductor pipeline memory device further comprises an addressing system 5 for selecting the addressable memory cells. Although the addressing system includes a row addressing sub-system and a pipeline column addressing sub-system, only the pipe line column addressing sub-system is illustrated and described hereinbelow.

The pipeline column addressing sub-system includes address input circuits 5a for producing column address data signals CL1 from an external column address signal ADD, a column address decoder 5b for decoding the column address data signals CL1 into column address decoded signals CL2 and two sets of latch circuits 5c and 5d respectively associated with the address input circuits 5a and the column address decoder 5b. The set of latch circuits 5c are responsive to a timing clock signal PH1 for storing the column address data signals CL1. The other set of latch circuits 5d are also responsive to the timing clock signal PH1, and store the column address decoded signal CL2. The column address decoded signals CL2 specifies one of the sense amplifier circuits 3 and, accordingly, a read-out data bit and a write-in data bit propagated to the selected sense amplifier circuit.

The prior art semiconductor pipeline memory device further comprises a controller 6 and a pipeline read-out/ write-in system for propagating read-out data bits and write-in data bits from and to the sense amplifier circuits 3. The controller 6 includes a clock input circuit 6a, and the clock input circuit 6a produces the timing clock signal PH1 from a system clock CLK. The timing clock signal PH1 rises in response to the leading edge of the system clock CLK, and the timing clock signal PH1 has a predetermined pulse width. Though not shown in FIG. 1, the controller 6 further includes a read-write controlling circuit, and the read-write controlling circuit is responsive to a read/write enable signal for changing the pipeline read-out/write-in system between a read-out phase and a write-in phase.

The pipeline read-out/write-in system includes a data input circuit 7a and a data output circuit 7b coupled in parallel to an input-and-output data pin DQ. An input data signal Sin indicative of a write-in data bit is supplied from the outside to the data input circuit 7a, and is temporarily stored in the data input circuit 7a. The data input circuit 7a produces a write-in data bit from the input data signal Sin, and is supplied to a selected sense amplifier circuit 3. On the other hand, a read-out data bit is supplied from a selected sense amplifier circuit 3 to the data output circuit 7b, and is temporally stored in the data output circuit 7b. The data output circuit 7b produces an output data signal Sout from the read-out data bit, and the output data signal Sout is supplied through the input-and-output data pin DQ to the outside.

The pipeline read-out/write-in system 7 further includes a write buffer 7c for the write-in data bit, a read buffer circuit 7d for the read-out data bit and a data amplifier circuit 7e coupled through a data bus 7f to the write buffer circuit 7c. Two latch circuits 7g and 7h are associated with the data input circuit 7a, and are coupled in series between the data input circuit 7a and the data bus 7f. On the other hand, one latch circuit 7i is coupled between the data amplifier circuit 7e and the data output circuit 7b. The latch circuits 7g, 7h and 7i are responsive to the timing clock signal PH1, and temporality store the write-in data bit and the read-out data bit. The data input circuit 7a, the latch circuits 7g and 7h, the data bus 7f and the write buffer circuit 7c constitute a write-in data propagation path for the write-in data bit, and the read buffer circuit 7d, the data bus 7f, the data amplifier circuit 7e, the latch circuit 7i and the data output circuit 7b form a read-out data propagation path. Thus, the data bus 7f is shared between the write-in data propagation path and the read-out data propagation path, and the write-in data propagation path and the read-out data propagation path are selectively enabled by the read-write controlling circuit (not shown) of the controller 6.

The prior art semiconductor pipeline memory device behaves as follows. The read-out data bit delivered from the selected sense amplifier circuit 3, the read buffer circuit 7d and the latch circuit 7i are labeled with "RD1", "RD2" and "RD3", respectively. On the other hand, the write-in data bit delivered from the data input circuit 7a, the latch circuit 7g, the latch circuit 7h and the write buffer circuit 7c are labeled with "WD1", "WD2", "WD3" and "WD4", respectively.

First, assuming now that the read/write enable signal causes the read-write controlling circuit to enable the read-out data propagation path. The row addressing sub-system (not shown) causes a row of addressable memory cells to put the read-out data bits on the bit line pairs 4, and the sense amplifier circuits 3 amplify the read-out data bits.

On the other hand, the column address signal ADD indicative of a column address A1 is supplied to the address port AP in synchronism with the system clock CLK(1), and the address input circuits 5a produce the column address data signals CL1. The column address data signals CL1 indicative of the column address A1 are latched by the latch circuits 5c in synchronism with the timing clock signal PH(1) at time t1, and the column address data signals CL1 are decoded to the column address decoded signals also indicative of the column address A1.

The column address signal ADD changes the column address to A2 in synchronism with the CLK(2), and the clock input circuit 6a raises the timing clock signal PH1(2) at time t2. The column address decoded signals CL2 are latched by the latch circuits 5d in synchronism with the timing clock signal PH1(2), and the column address data signals CL1 are latched by the latch circuits 5c also in synchronism with the timing clock signal PH1(2). The column address decoder 5b decodes the data signals CL1 indicative of the column address A2 into the column address decoded signals CL2.

The column address decoded signals CL2 stored in the latch circuits 5d select the read-out data bit RD1(1) read out from the addressable memory cell assigned the column address A1, and the read-out data bit RD(1) is supplied through the read buffer circuit 7d and the data bus 7f to the data amplifier circuit 7e. The data amplifier circuit 7e amplifies the read-out data bit RD1(1), and supplies the read-out data bit RD2(1) to the latch circuit 7i.

The system clock CLK(3) causes the timing clock signal PH1(3) to rise at time t3. The latch circuit 7i latches the read-out data bit RD2(1), and supplies the read-out data bit RD3(1) to the data output circuit 7b. The data output circuit 7b produces the output data signal Sout(1) from the read-out data bit RD3(1), and the output data signal Sout(1) is delivered from the input-and-output data pin DQ to the outside.

The latch circuits 5d latch the column address decoded signals indicative of the column address A2 also in synchronism with the timing clock signal PH1(3), and the sense amplifier circuits 3 supply the read-out data bit RD1(2) read out from the addressable memory cell assigned the column address A2. The read-out data bit RD1(2) is supplied through the read buffer circuit 7d and the data bus 7f to the data amplifier circuit 7e, and the data amplifier circuit 7e supplies the read-out data bit RD2(2) to the latch circuit 7i.

The system clock CLK(4) causes the timing clock signal PH1(4) to rise at time t4, and the latch circuit latches the read-out data bit RD2(2) in synchronism with the timing clock signal PH1(4). The latch circuit 7i supplies the read-out data bit RD3(2) to the data output circuit 7b, and the data output circuit 7b produces the output data signal Sout(2). The output data signal Sout(2) is delivered from the input-and-output data pin DQ to the outside.

Thus, the column addressing sub-system and the readout data propagation path transfer the column addresses and the read-out data bits in the pipeline fashion.

FIG. 3 illustrates the pipeline write-in operation. The row addressing sub-system (not shown) selects one of the rows of addressable memory cells, and electrically couples the bit line pairs 4 to the selected addressable memory cells, respectively. The column address signal ADD indicative of the column address A1 is supplied to the address port AP in synchronism with the system clock signal CLK(5), and the address input circuits 5a produce the column address data signals CL1. The input data signal Sin(1) is also supplied to the input-output data pin DQ in synchronism with the system clock CLK(5), and the data input circuit 7a produces the write-in data bit WD1(1).

The system clock CLK(5) causes the timing clock signal PH1(5) to rise at time t5, and the timing clock signal PH1(5) is distributed to the latch circuits 5c, 5d, 7g, 7h and 7i. The latch circuits 5c temporarily store the column address data signals CL1 in response to the timing clock signal PH1(5), and the column address decoder 5b decodes the column address data signals CL1 to the column address decoded signals CL2 indicative of the column address A1.

The write-in data bit WD1(1) is also latched by the latch circuit 7g in response to the timing clock signal PH1(5). Then, the latch circuit 7g supplies the write-in data bit WD2(1) to the next stage. However, the write-in data bit WD2(1) is not latched because the timing clock signal PH1(5) has been already recovered to the low level.

The column address signal ADD changes the column address to "A2" in synchronism with the system clock CLK(6), and the input data signal Sin also changes the value to "Sin(2)" in synchronism with the system clock CLK(6). The clock input circuit 6a raises the timing clock signal PH1(6) at time t6.

The latch circuit 7h is responsive to the timing clock signal PH1(6), and latches the write-in data bit WD2(1). The latch circuit 7h supplies the write-in data bit WD3(1) to the write buffer circuit 7c, and the write buffer circuit 7c supplies the write-in data bit WD4(1) to the sense amplifier circuits 3.

The latch circuits 5d stores the column address decoded signals CL2 indicative of the column address A1, and the write-in data bit WD4(1) is transferred to one of the sense amplifier circuits 3. The selected sense amplifier circuit 3 amplifies the write-in data bit WD4(1), and the write-in data bit WD4(1) is written into the addressable memory cell assigned the column address A1.

The address input circuits 5a produce the column address data signals CL1 indicative of the column address A2, and the column address data signals CL1 are latched by the latch circuits 5c in response to the timing clock signal PH1(6).

The data input circuit 7a produces the write-in data bit WD1(2), and the latch circuit 7g latches the write-in data bit WD1(2) in response to the timing clock signal PH1(6). The latch circuit 7g supplies the write-in data bit WD2(2) to the next stage 7h. However, the timing clock signal PH1(7) has been already recovered, and the latch circuit 7h does not store the write-in data bit WD2(2).

The system clock CLK(7) causes the clock input circuit 6a to raise the timing clock signal PH1(7) at time t7. The latch circuits 5d latches the column address decoded signals CL2 in response to the timing clock signal PHI(7), and the column address decoded signals CL2 selects another sense amplifier circuit associated with the addressable memory cell assigned the column address A2.

The latch circuit 7h is also responsive to the timing clock signal PH1(7), and latches the write-in data bit WD2(2). The latch circuit 7h supplies the write-in data bit WD3(2) through the data bus 7f to the write buffer circuit 7c, and the write buffer circuit 7c supplies the write-in data bit WD4(2) to the selected sense amplifier circuit 3. The sense amplifier circuit 3 amplifies the write-in data bit WD4(2), and the write-in data bit WD(2) is written into the addressable memory cell assigned the column address A2.

Thus, the write-in data bits are sequentially written into the selected addressable memory cells through the pipeline column addressing and the pipeline data transmission.

The column addressing sub-system is assumed to consume time t1 for transferring the column address between the latch circuits 5c and 5d. The transfer operation from the address latch in the latch circuits 5d to the read-out data latch in the latch circuits 7i is assumed to consume time t2. The data transfer from the latch circuit 7i to the input-output data pin DQ is assumed to consume time t3. The time interval t3 is the access time of the prior art semiconductor pipeline memory device, and either time t1 or t2 longer than the other is the cycle time. The latch circuit 7i is usually located to be close to the input-and-output data pin DQ, and, for this reason, the access time t3 is shorter than the cycle time t1 or t2.

The latch circuits 5d are located closer to the address port AP than the sense amplifier circuits 3, and, accordingly, the time t2 is usually longer than the time t1. The address access time T is expressed by equation 1.

$$T = t2 \times 2 + t3 \qquad \text{Equation 1}$$

The address access time T is longer than the total time (t1+t2+t3), and time loss TL takes place as follows.

$$\begin{aligned} TL &= (t2 \times 2 + t3) - (t1 + t2 + t3) \qquad \text{Equation 2} \\ &= t2 - t1 \end{aligned}$$

Thus, the time t2 is longer than the time t1 due to the location of the latch circuits 5d closer to the address port AP than the sense amplifier circuits 3, and the undesirable time loss TL takes place. The time loss TL is determined by the pipeline configuration, and is hardly decreased through the simulation and the evaluation of an actual product.

SUMMARY OF THE INVENTION

It is therefore an important object of the present invention to provide a semiconductor pipeline memory device which decreases the time loss.

To accomplish the object, the present invention proposes to assign a long data propagation to a time interval over two pipeline cycles.

In accordance with the present invention, there is provided a semiconductor pipeline memory device comprising: a plurality of addressable memory cells for storing data bits, respectively; a plurality of data propagation paths selectively coupled to the plurality of addressable memory cells; an addressing system responsive to an external address signal supplied to an address port so as to make the plurality of addressable memory cells selectively accessible; a data propagation system coupled between the plurality of data propagation paths and a data port; and a pipeline controlling system causing the addressing system and the data propagation system to trace a pipeline sequence from an address input to a data supply, and producing at least a first timing clock signal changed to a first active level in each of pipeline cycles, a second timing clock signal changed to a second active level after the first timing clock signal in each of the pipeline cycles and a third timing clock signal changed to a third active level between the first timing clock signal and the second timing clock signal in each of the pipeline cycles, the pipeline sequence including a first pipeline stage close to the address port and having first temporary storage means responsive to the first timing clock signal so as to achieve a first task in a first time interval between the first timing clock signal in each of the pipeline cycles and the second timing clock signal in the same pipeline cycle, a second pipeline stage contiguous to the first pipeline stage and having second temporary storage means responsive to the second and third timing clock signals so as to achieve a second task in a second time interval between the second timing clock signal in each of the pipeline cycles and the third timing clock signal in the next pipeline cycle, and a third pipeline stage contiguous to the second pipeline stage and having third temporary storage means responsive to the first timing clock signal so as to achieve a third task in a third time interval between the third timing clock signal in each of the pipeline cycles and the first timing clock signal in the next pipeline cycle.

BRIEF DESCRIPTION OF THE DRAWINGS

The features and advantages of the semiconductor pipeline memory device according to the present invention will be more clearly understood from the following description taken in conjunction with the accompanying drawings in which:

FIG. 10 is a timing chart showing a pipeline read-out operation of the semiconductor pipeline memory device shown in FIG. 8.

DESCRIPTION OF THE PREFERRED EMBODIMENTS

First Embodiment

Figure 1:
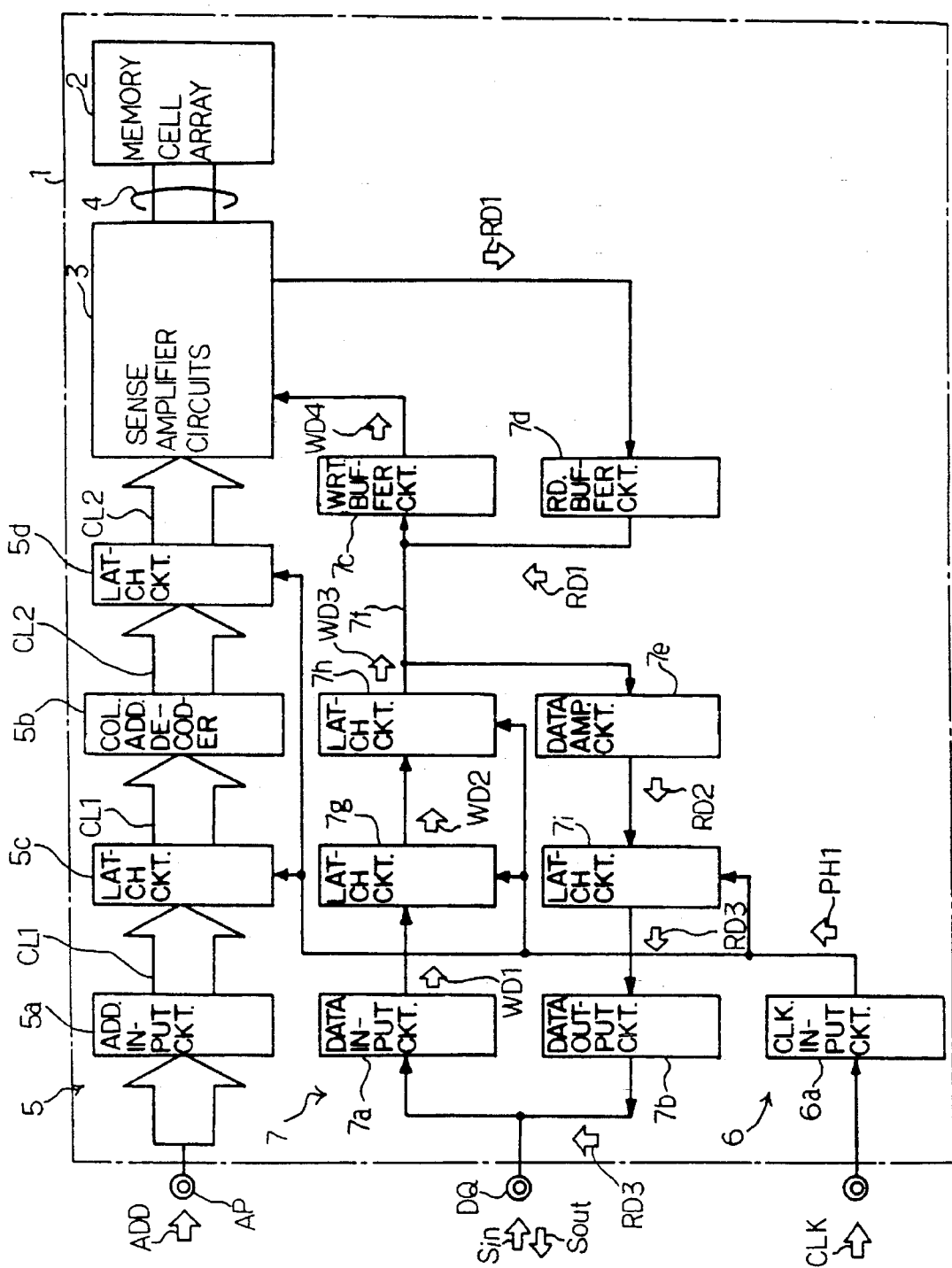
FIG. 1 is a block diagram showing the arrangement of the prior art semiconductor pipeline memory device.
Figure 2:
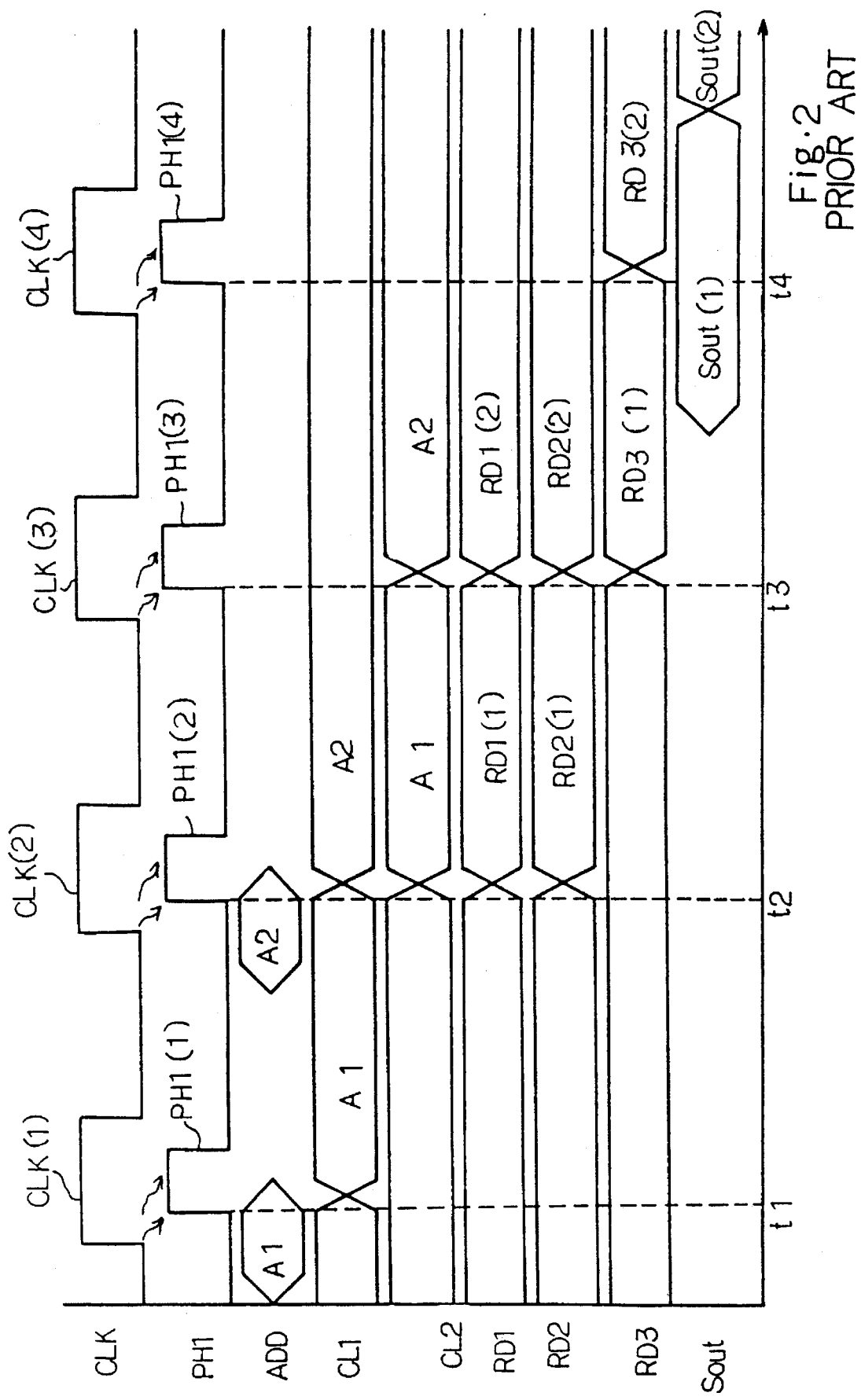
FIG. 2 is a timing chart showing the read-out operation of the prior art semiconductor pipeline memory device.
Figure 3:
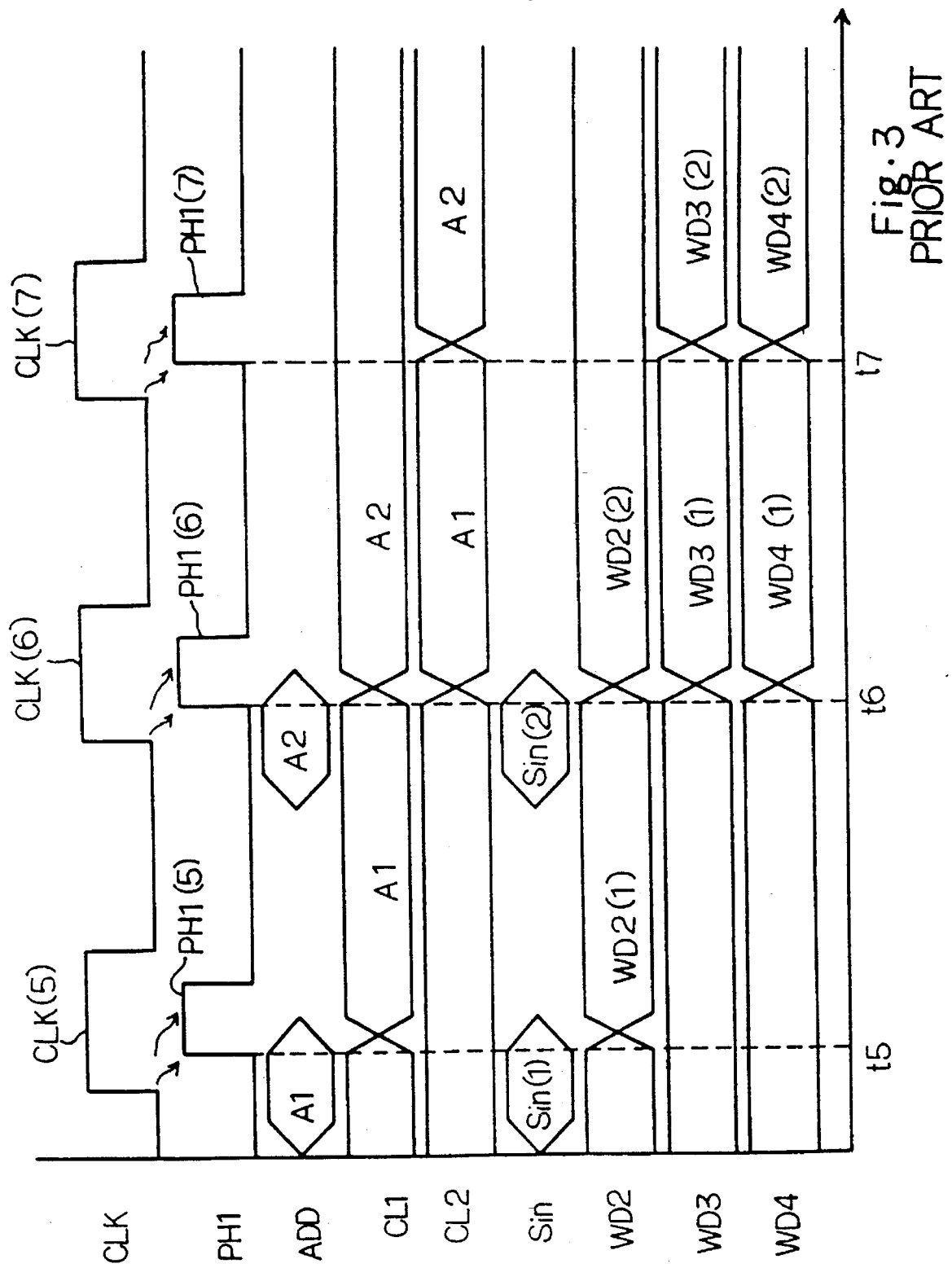
FIG. 3 is a timing chart showing the write-in operation of the prior art semiconductor pipeline memory device.
Figure 4:
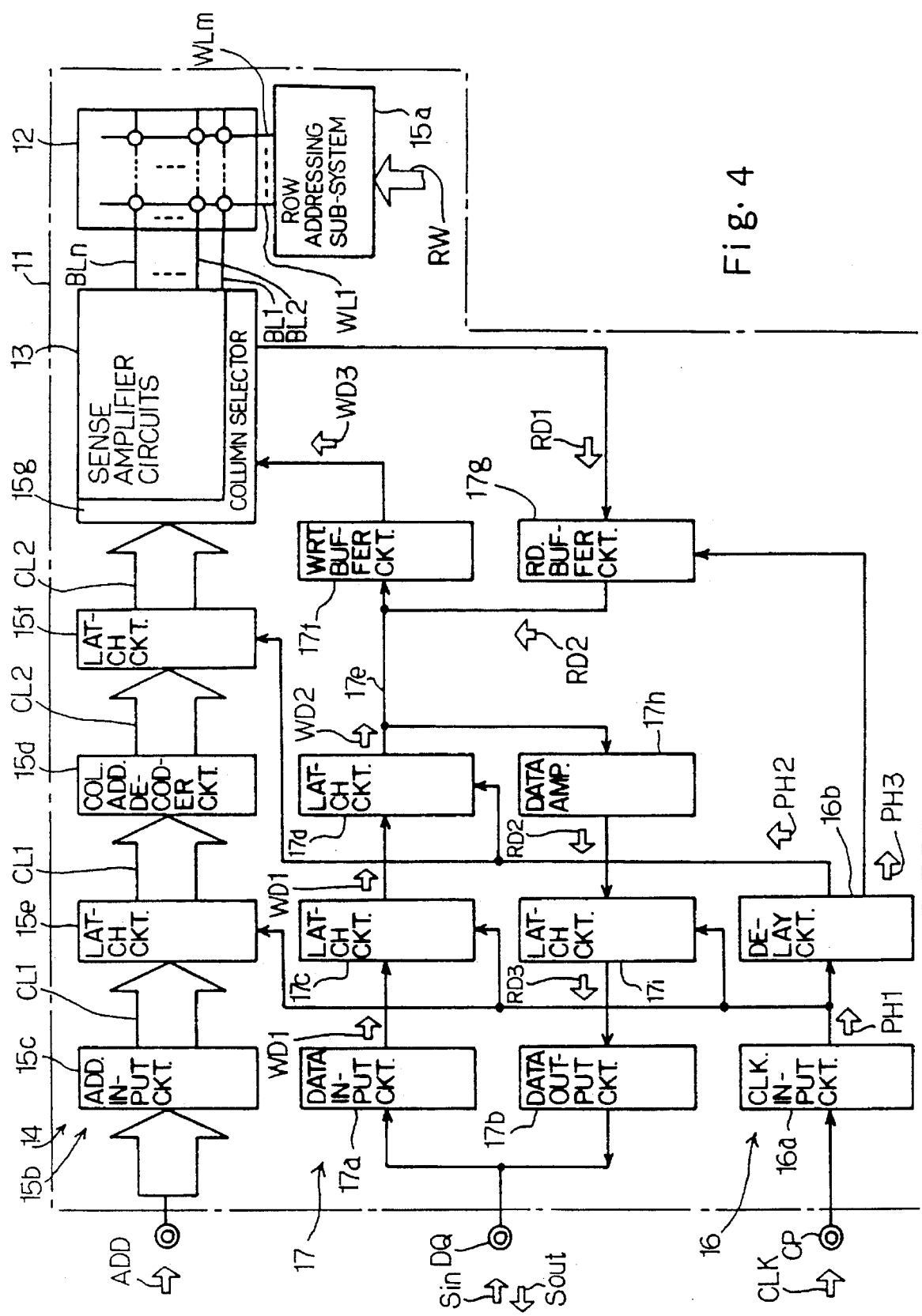
FIG. 4 is a block diagram showing the arrangement of a semiconductor pipeline memory device according to the present invention.

Referring first to FIG. 4 of the drawings, a semiconductor pipeline memory device embodying the present invention is fabricated on a semiconductor chip 11, and largely comprises a memory cell array 12, a sense amplifier circuits 13, an addressing system 14, a controller 16 and a pipeline read-write system 17. The semiconductor pipeline memory device is changed between a write-in phase and a read-out phase, and data bits are sequentially written into and read out from the memory cell array 12 in a pipeline fashion.

A plurality of memory cells form in combination with the memory cell array 12, and small bubbles stand for the plurality of memory cells. The plurality of memory cells are arranged in rows and columns as shown. Word lines WL1 to WLm are respectively coupled to the rows of memory cells, and are selectively energized so as to select a row of memory cells. Bit line pairs BL1, BL2 to BLn are respectively coupled to the columns of memory cells, and data bits are propagated to and from the selected row of memory cells.

The sense amplifier circuits 13 are respectively coupled to the bit line pairs BL1, BL2, . . . and BLn, and amplify the data bits on the bit line pairs BL1 to BLn.

The addressing system 14 includes a row addressing sub-system 15a for selectively energizing the word lines WL1 to WLm and a column addressing sub-system 15b. The row addressing sub-system 15a is responsive to row address data signals RW produced from a external multi-bit row address signal so as to energize one of the word lines WL1 to WLm.

The column addressing sub-system 15b includes address input circuits 15c for producing column address data signals CL1 from an external multi-bit column address signal ADD, a pipeline column address decoder 15d for decoding the column address data signals CL1 into column address decoded signals CL2 and two sets of latch circuits 15e and 15f respectively associated with the address input circuits 15c and the column address decoder 15d. The set of latch circuits 15e are responsive to a first timing clock signal PH1 for storing the column address data signals CL1. On the other hand, the other set of latch circuits 15f are responsive to a second timing clock signal PH2, and store the column address decoded signal CL2. The second timing clock signal PH2 is produced from the first timing clock signal PH1 as will be described hereinlater.

The pipeline column addressing sub-system 15b further includes a column selector 15g coupled to the bit line pairs BL1 to BLn, and column address decoded signals CL2 causing the column selector 15g to propagate a data bit on one of the bit line pairs BL1 to BLn therethrough. For this reason, a data bit is transferred from the selected bit line to the read-write system 17 in the read-out phase and from the read-write system 17 to the selected bit line in the write-in phase.

Figure 5:
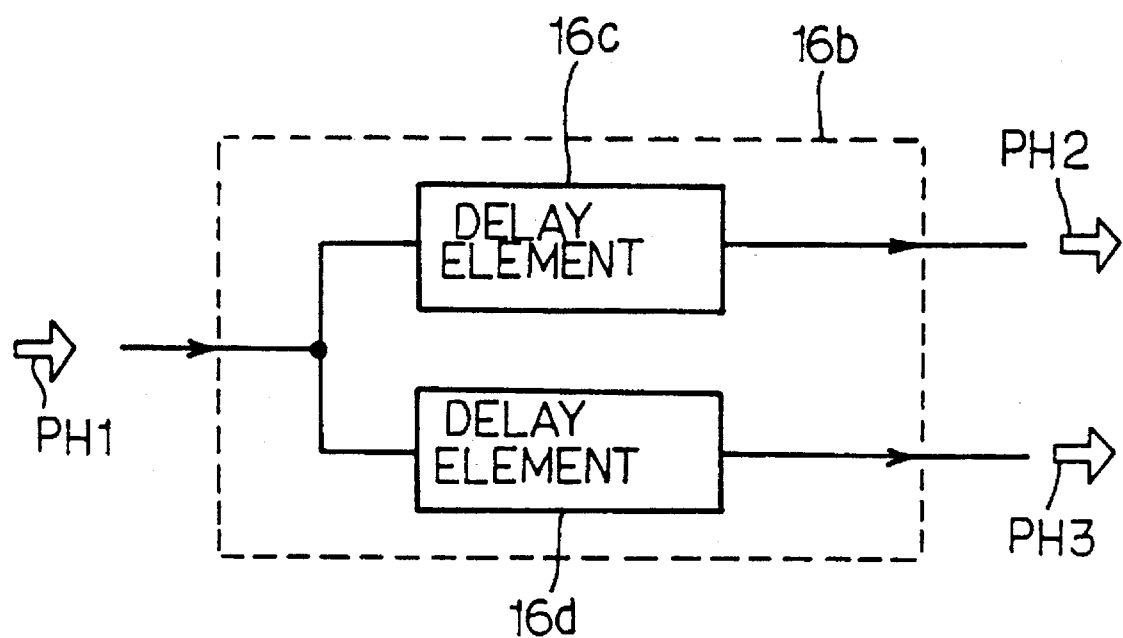
FIG. 5 is a diagram showing the circuit arrangement of a delay circuit incorporated with the semiconductor pipeline memory device.

The controller 16 includes a clock input circuit 16a coupled to a clock input pin CP and a delay circuit 16b coupled to the clock input circuit 16a, and the clock input circuit 16a produces the first timing clock signal PH1 from a system clock CLK. As shown in FIG. 5, the delay circuit 16b is implemented by two delay elements 16c and 16d coupled in parallel. The delay element 16c introduces first time delay into the first timing clock signal PH1 so as to produce the second timing clock signal PH2, and the other delay element 16d also introduces second time delay different from the first time delay into the first timing clock signal PH1 so as to produce the third timing clock signal PH3. The time delays are determined in such a manner as to take the signal propagation length of each pipeline stage. In this instance, the second time delay is longer than the first time delay, because the read buffer circuit 17g is closer to the column selector 15g than the latch circuits 15f. In this way, the delay circuit 16b produces the second timing clock signal PH2 and the third timing clock signal PH3 from the first timing clock signal PH1. The first time delay and the second time delay are regulable by changing wirings of the delay elements 16c and 16d, and the wiring step is carried out after diffusions in a fabrication process sequence.

The first timing clock signal PH1 rises in response to the leading edge of the system clock CLK. The first timing clock signal PH1 has a predetermined pulse width, and, accordingly, the second and third timing clock signals PH2 and PH3 also have the predetermined pulse width. Though not shown in FIG. 4, the controller 16 further includes a read-write controlling circuit, and the read-write controlling circuit is responsive to a read/write enable signal for changing the pipeline read-write system 17 between the read-out phase and the write-in phase.

The pipeline read-write system 17 includes a data input circuit 17a and a data output circuit 17b coupled in parallel to an input-and-output data pin DQ. The data input circuit 17a forms a part of a pipeline write-in data propagation path, and the output circuit 17b is incorporated in a pipeline read-out data propagation path.

An input data signal Sin indicative of a write-in data bit is supplied from the outside to the data input circuit 17a, and is temporarily stored in the data input circuit 17a. The data input circuit 17a produces a write-in data bit WD1 from the input data signal Sin, and the write-in data bit is transferred through the pipeline write-in data propagation path to the column selector 15g. On the other hand, a read-out data bit RD1 is supplied from the column selector 15g through the pipeline read-out data propagation path to the data output circuit 17b, and is temporally stored in the data output circuit 17b. The data output circuit 17b produces an output data signal Sout from the read-out data bit, and the output data signal Sout is supplied through the input-and-output data pin DQ to the outside.

The pipeline write-in data propagation path further includes latch circuits 17c and 17d, a data bus 17e and a write buffer circuit 17f. The latch circuits 17c and 17d are coupled in series between the data input circuit 17a and the data bus 17e, and the data bus 17e is coupled to the write buffer circuit 17f. The latch circuits 17c and 17d are responsive to the first timing clock signal PH1 and the second timing clock signal PH2 so as to temporarily store the write-in data bit. The write buffer circuit 17f is coupled to the column selector 15g, and supplies the write-in data bit through the column selector 15g to a selected bit line pair. Although the write-in data bit latched by the latch circuit 17c is labeled with "WD1", the write-in data bit delivered from the latch circuit 17d is labeled with "WD2", and "WD3" stands for the write-in data bit supplied from the write buffer circuit 17f to the column selector 15g.

The pipeline read-out data propagation path further includes a read buffer circuit 17g, the data bus 17e, a data amplifier 17h and a latch circuit 17i coupled between the column selector 15g to the data output circuit 17b, and the data bus 17e is shared between the pipeline write-in data propagation path and the pipeline read-out data propagation path. The read buffer circuit 17g is responsive to the third timing clock signal PH3 for storing the read-out data bit RD1, and the latch circuit 17i latches the read-out data bit in response to the first timing control signal PH1. The read-out data bit delivered from the read buffer circuit 17g is labeled with "RD2", and the data amplifier 17h amplifies the read-out data bit RD2. The read-out data bit delivered from the latch circuit 17i is labeled with "RD3", and the data output circuit 17b produces the output data signal Sout from the read-out data bit RD3. The pipeline write-in data propagation path and the pipeline read-out data propagation path are selectively enabled by the read-write controlling circuit (not shown) of the controller 16.

In a pipeline read-out operation, the first pipeline stage is from the latch circuits 15e to the latch circuits 5d, the second pipeline stage is from the latch circuits 15f through the read buffer circuit 17g to the latch circuit 17i, and the third pipeline stage is from the latch circuit 7i to the delivery of the output data signal Sout from the input-and-output data pin DQ.

As described hereinbefore, signal propagation times of the first time delay $t_D1$ and the second time delay $t2$ are determined by taking signal propagation times along the first to third pipeline stages. In detail, if the first pipeline stage consumes a signal propagation time $t1$, the first delay time $t_D1$ is determined to be equal to the signal propagation time $t1$ as follows.

$$t_D1 = t1 \qquad \text{Equation 3}$$

The signal propagation time $t2$ in the second pipeline stage is constituted by a first signal propagation sub-time $t21$ from the latch circuits 15f to the read buffer circuit 17g and a second signal propagation sub-time t22 from the latch circuits 15f to the latch circuit 17i. The second time delay $t_D2$ satisfies equations 4 and 5.

$$t1+t21=(t1+t2)/2+t_D2 \qquad \text{Equation 4}$$

$$t22=(t1+t2)/2-t_D2 \qquad \text{Equation 5}$$

The first and second time delays thus determined are minimum, and make the signal propagation times t1 and t2 equal to each other. The address access time T in the read-out phase is expressed by equation 6.

$$T=t1+t2+t3 \qquad \text{Equation 6}$$

The read buffer circuit 17g is located at a closer position to the latch circuit 17i than a mid point between the latch circuits 15e and the latch circuit 17g, and the second time delay $t_D2$ does not take a negative value.

The semiconductor pipeline memory device according to the present invention behaves as follows. First, assuming now that an external device such as a microprocessor is requested to read the data bits stored in the memory cells sharing a row address and respectively assigned column addresses A1 and A2, the external device supplies the read/write enable signal, and the read-write controlling circuit enables the pipeline read-out data propagation path. The external device supplies the multi-bit row address signal to the row addressing sub-system 15a, and the row addressing sub-system 15a energizes the word line WL1, by way of example, and electrically connects a row of memory cells to the bit line pairs BL1 to BLn. The data bits are read out from the selected row of memory cells to the bit line pairs BL1 to BLn, respectively, and the sense amplifier circuits 13 amplify the read-out data bits on the bit line pairs BL1 to BLn.

Figure 6:
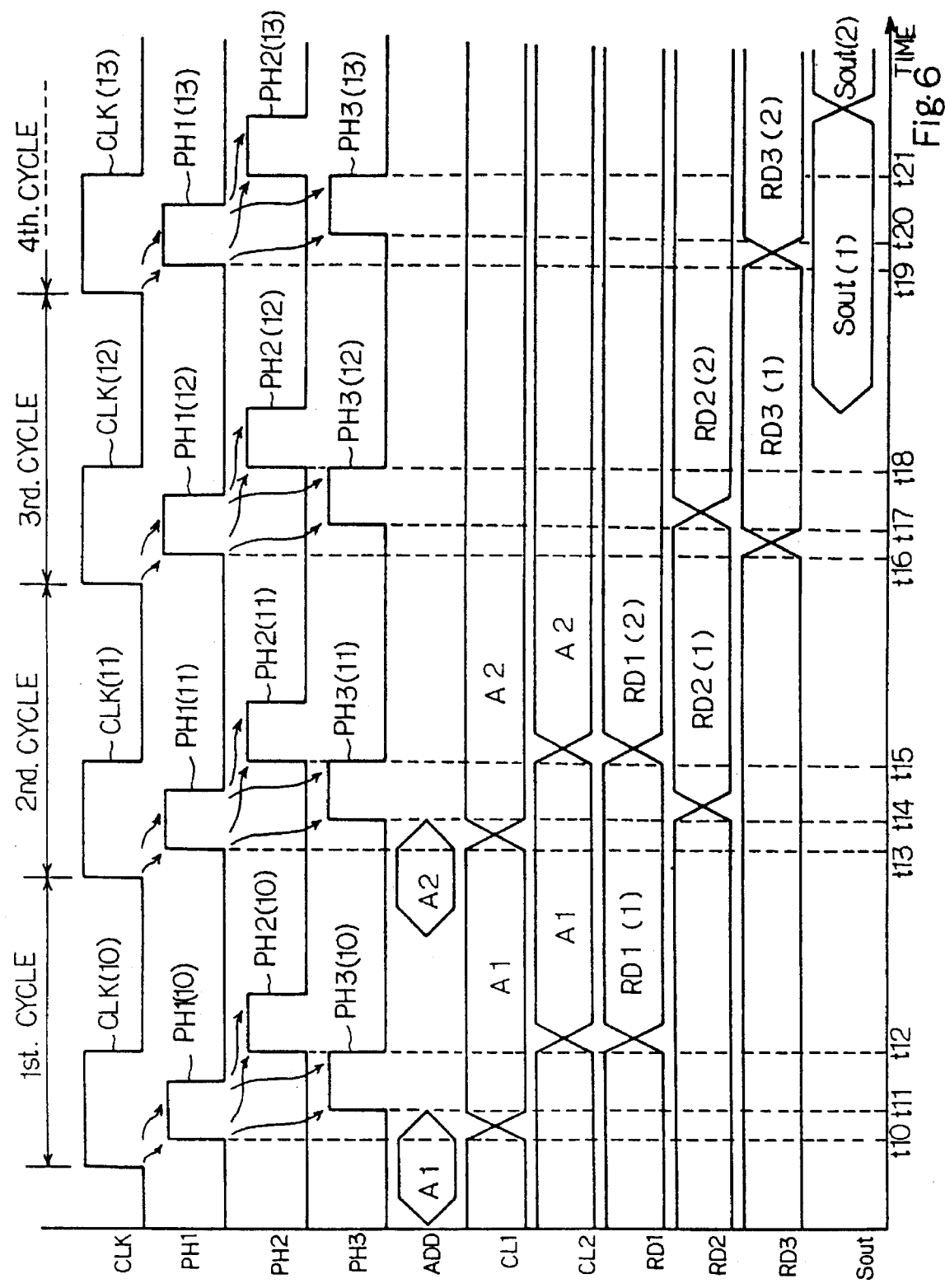
FIG. 6 is a timing chart showing a pipeline read-out operation of the semiconductor pipeline memory device.

The external device supplies the multi-bit column address signal ADD indicative of the column address A1 to the address port AP in synchronism with the system clock CLK(10) (see FIG. 6), and the address input circuits 15c produce the column address data signals CL1.

The clock input circuit 16a is responsive to the system clock CLK(10) so as to produce the first timing clock signal PH1(10) at time t10, and the delay elements 16c and 16d outputs the second timing clock signal PH2(10) and the third timing clock signal PH3(10) at time t11 and time t12, respectively.

The column address data signals CL1 indicative of the column address A1 are latched by the latch circuits 5c in response to the timing clock signal PH1(10), and the column address data signals CL1 are decoded to the column address decoded signals CL2 also indicative of the column address A1. However, the column address decoded signals CL2 wait for the second timing clock signal PH2(10).

The third timing clock signal PH3(10) rises at time t11, and makes the read buffer circuit 17g active.

Thereafter, the second timing clock signal PH2(10) rises at time t12, and the latch circuits 15f latch the column address decoded signals CL2 indicative of the column address A1 in response to the second timing clock signal PH2(10). The column selector 15g couples the bit line pair BL1 to the input node of the read buffer circuit 17g, and the read-out data bit RD1(1) reaches the read buffer circuit 17g. However, the third timing clock signal PH3(10) has been already recovered to the inactive low level, and the read-out data bit RD1(1) is not stored in the read buffer circuit 17g.

The external device changes the multi-bit column address signal ADD to A2 in synchronism with the system clock CLK(11), and the address input circuits 15c produce the column address data signals CL1 from the multi-bit column address signal ADD indicative of the column address A2. The clock input circuit 16a raises the first timing clock signal PH1(11) at time t13, and the delay circuit 16b raise the third timing control signal PH3(11) at time t14 and the second timing control signal PH2(11) at time t15.

The column address data signals CL1 indicative of the column address A2 are latched by the latch circuits 15e in response to the first timing control signal PH1(11), and the read buffer circuit 17g stores the read-out data bit RD1(1) in response to the third timing clock signal PH3(11). The read buffer circuit 17g supplies the read-out data bit RD2(1) through the data bus 17e to the data amplifier 17h, and the data amplifier 17h amplifies the read-out data bit RD2(1). Although the data amplifier 17h supplies the read-out data bit RD2(1) to the latch circuit 17i, the first timing clock signal PH1(11) has been already recovered to the inactive low level, and the read-out data bit RD2(1) is not stored in the latch circuit 17i.

The latch circuits 15f latch the column address decoded signals CL2 indicative of the column address A2 in response to the second timing clock signal PH2(11), and supply the column address decoded signals CL2 to the column selector 15g. The column selector 15g couples the bit line pair BL2 to the input of the read buffer circuit 17g, and the read-out data bit RD1(2) is supplied to the read buffer circuit 17g. The third timing clock signal PH3(11) is recovered to the inactive low level by time t15, and the read-out data bit RD1(2) is not stored in the read buffer circuit 17g in the second cycle.

The system clock CLK(12) causes the clock input circuit 16a to raise the first timing clock signal PH1(12) at time t16, and the delay circuit 16b raises the third timing clock signal PH3(12) at time t17 and the second timing clock signal PH2(12) at time t18, respectively.

The latch circuit 17i latches the read-out data bit RD2(1) in response to the first timing clock signal PH1(12), and supplies the read-out data bit RD3(1) to the data output circuit 17b. The data output circuit 17b produces the output data signal Sout(1) from the read-out data bit RD3(1), and the output data signal Sout(1) is supplied to the input-and-output data pin DQ.

The read buffer circuit 17g latches the read-out data bit RD1(2) in response to the third timing clock signal PH3(12), and the read buffer circuit 17g supplies the read-out data bit RD2(2) to the data amplifier 17h. The data amplifier 17h amplifies the read-out data bit RD2(2), and supplies the read-out data bit RD2(2) to the latch circuit 17i. However, the latch circuit 17i does not store the read-out data bit RD2(2), since the first timing clock signal PH1(12) has been already recovered to the inactive low level.

The system clock CLK(13) causes the clock input circuit 16a to raise the first timing clock signal PH1(13) at time t19, and the delay circuit 16b produces the third timing clock signal PH3(13) at time t20 and the second timing clock signal PH2(13) at time t21.

The latch circuit 17i is responsive to the first timing clock signal PH1(13) so as to store the read-out data bit RD2(2), and supplies the read-out data bit RD3(2) to the data output circuit 17b. The data output circuit 17b produces the output data signal Sout(2) from the read-out data bit RD3(2), and the output data signal Sout(2) is delivered through the input-and-output data pin DQ to the external device.

As will be understood from the foregoing description, pipeline read-out operation allows the second pipeline stage to extend over two cycles, and prolongs the time interval from the address latch into the latch circuits 15f to the data latch into the read buffer circuit 17g. For example, the column address decoded signals CL2 are latched in response to the second timing clock signal PH2(10) at time t12, and the read-out data bit PH1(1) is stored in the read buffer circuit 17g in response to the third timing clock PH3(11) at time t14. In other words, the second pipeline stage is allowed to consume the long time interval between t12 and t14. Similarly, the long time period from time t11/t14 to time t13/t16 is assigned the third pipeline stage, and the third pipeline stage is allowed to complete the data transfer and the data amplification within the long time interval. The first pipeline stage is relatively short, and the relatively short time interval between time t10/t13 and time t12/t15 is assigned to the second pipeline stage. Thus, the first to third pipeline stages are respectively assigned appropriate time intervals depending upon the signal propagation path, and time loss is minimized.

Figure 7:
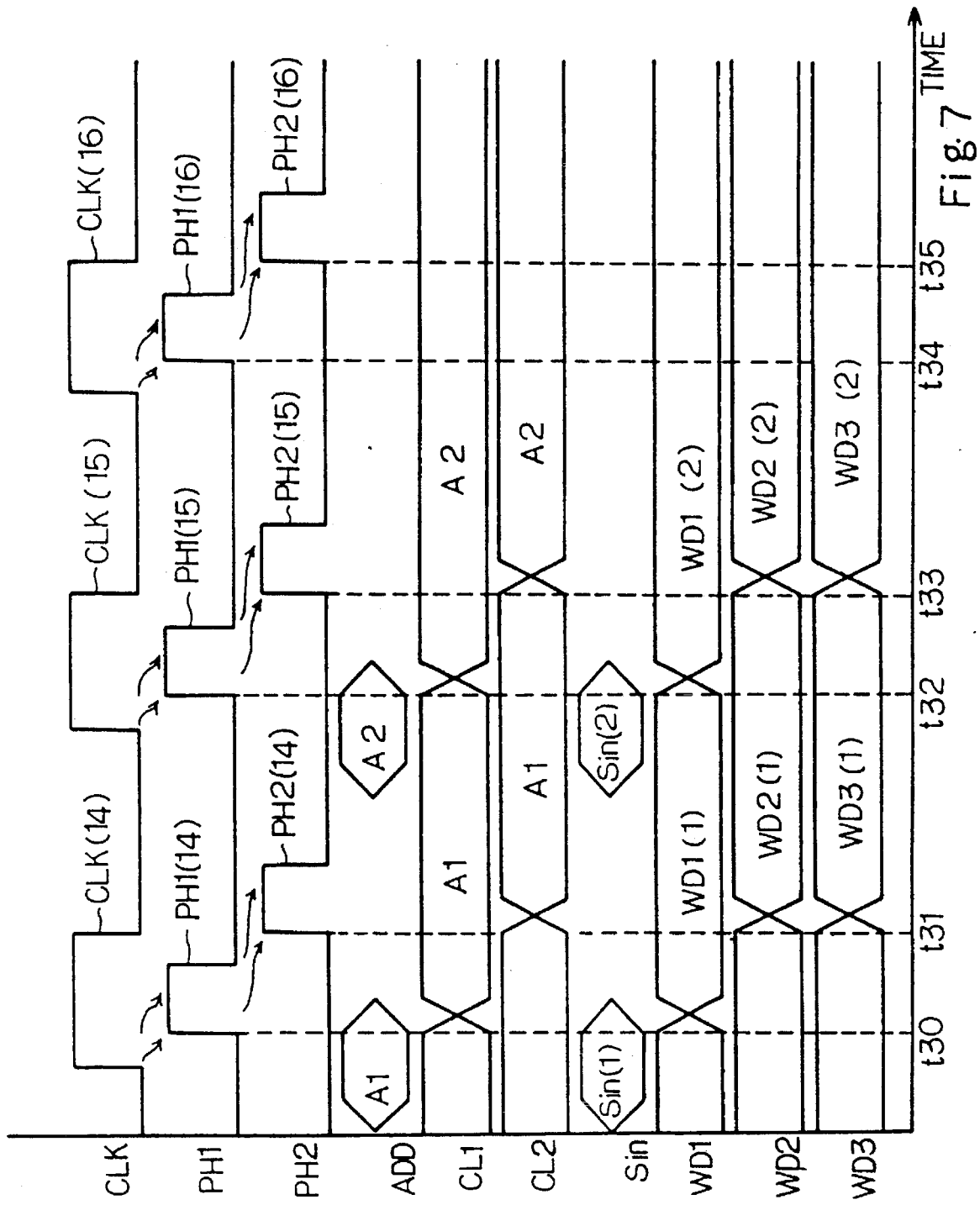
FIG. 7 is a timing chart showing a pipeline write-in operation of the semiconductor pipeline memory device.

FIG. 7 illustrates the pipeline write-in operation. The row addressing sub-system 15a is assumed to select the row of memory cells coupled to the word line WL1, and electrically couples the bit line pairs BL1 to BLn to the selected row of memory cells, respectively.

The external device supplies the column address signal ADD indicative of the column address A1 to the address input circuits 15c in synchronism with the system clock signal CLK(14), and the address input circuits 15c produce the column address data signals CL1. The input data signal Sin(1) is also supplied through the input-output data pin DQ to the data input circuit 17a in synchronism with the system clock CLK(14), and the data input circuit 17a produces the write-in data bit WD1(1).

The system clock CLK(14) causes the clock input circuit 16a to raise the first timing clock signal PH1(14) at time t30, and the delay circuit 16b produces the second timing clock signal PH2(14) at time t31.

The latch circuits 15e temporarily store the column address data signals CL1 in response to the first timing clock signal PH1(14), and the column address decoder 15d decodes the column address data signals CL1 to the column address decoded signals CL2 indicative of the column address A1.

The write-in data bit WD1(1) is also latched by the latch circuit 17c in response to the first timing clock signal PH1(14), and the write-in data bit WD1(1) is transferred to the latch circuit 17d.

The latch circuits 15f is responsive to the second timing clock signal PH2(14) so as to store the column address decoded signals CL2 indicative of the column address A1, and the column address decoded signals CL2 cause the column selector 15g to couple the write buffer circuit 17f to the bit line pair BL1.

The latch circuit 17d is also responsive to the second timing clock signal PH2(14) so as to latch the write-in data bit WD1(1), and supplies the write-in data bit WD2(1) through the data bus 17e to the write buffer circuit 17f. The write buffer circuit 17f has been already coupled through the column selector 15g to the bit line pair BL1, and the write buffer circuit 17f supplies the write-in data bit WD3(1) to the bit line pair BL1. The bit line pair BL1 propagates the write-in data bit WD3(1) to the memory cell assigned the column address A1, and the write-in data bit WD3(1) is written into the memory cell.

The external device supplies the column address signal ADD indicative of the column address A2 to the address input circuits 15c in synchronism with the system clock signal CLK(15), and the address input circuits 15c produce the column address data signals CL1. The input data signal Sin(2) is also supplied through the input-output data pin DQ to the data input circuit 17a in synchronism with the system clock CLK(15), and the data input circuit 17a produces the write-in data bit WD1(2).

The system clock CLK(15) causes the clock input circuit 16a to raise the first timing clock signal PH1(15) at time t32, and the delay circuit 16b produces the second timing clock signal PH2(15) at time t33.

The latch circuits 15e temporarily store the column address data signals CL1 in response to the first timing clock signal PH1(15), and the column address decoder 15d decodes the column address data signals CL1 to the column address decoded signals CL2 indicative of the column address A2.

The write-in data bit WD1(1) is also latched by the latch circuit 17c in response to the first timing clock signal PH1(15), and the write-in data bit WD1(2) is transferred to the latch circuit 17d.

The latch circuits 15f is responsive to the second timing clock signal PH2(15) so as to store the column address decoded signals CL2 indicative of the column address A2, and the column address decoded signals CL2 cause the column selector 15g to couple the write buffer circuit 17f to the bit line pair BL2.

The latch circuit 17d is also responsive to the second timing clock signal PH2(15) so as to latch the write-in data bit WD1(2), and supplies the write-in data bit WD2(2) through the data bus 17e to the write buffer circuit 17f. The write buffer circuit 17f has been already coupled through the column selector 15g to the bit line pair BL2, and the write buffer circuit 17f supplies the write-in data bit WD3(2) to the bit line pair BL1. The bit line pair BL1 propagates the write-in data bit WD3(2) to the memory cell assigned the column address A2, and the write-in data bit WD3(2) is written into the memory cell.

In this instance, the bit line pairs BL1 to BLn serve as the plurality of data propagation paths, and the pipeline read-write system 17 and the column selector 15g as a whole constitute the data propagation system. The first temporary storage means is implemented by the latch circuits 15e, and the latch circuits 15f and the read buffer circuit 17g form in combination the second temporary storage means. The latch circuit 17i serves as the third temporary storage means. The first task is the column address transfer through the latch circuits 15e to the latch circuits 15f. The second task is the column address transfer from the latch circuits 15f to the column selector 15g and the data transfer from the selected bit line through the column selector 15g to the read buffer circuit 17g. The third task is the data transfer from the read buffer circuit 17g to the latch circuit 17i.

As will be appreciated from the foregoing description, the first and second timing clock signals PH1 and PH2 accelerate the pipeline write-in operation, and the pipeline column addressing sub-system 15b and the pipeline write-in data propagation path complete the write-in operation on each write-in data bit within a single cycle.

Second Embodiment

Figure 8:
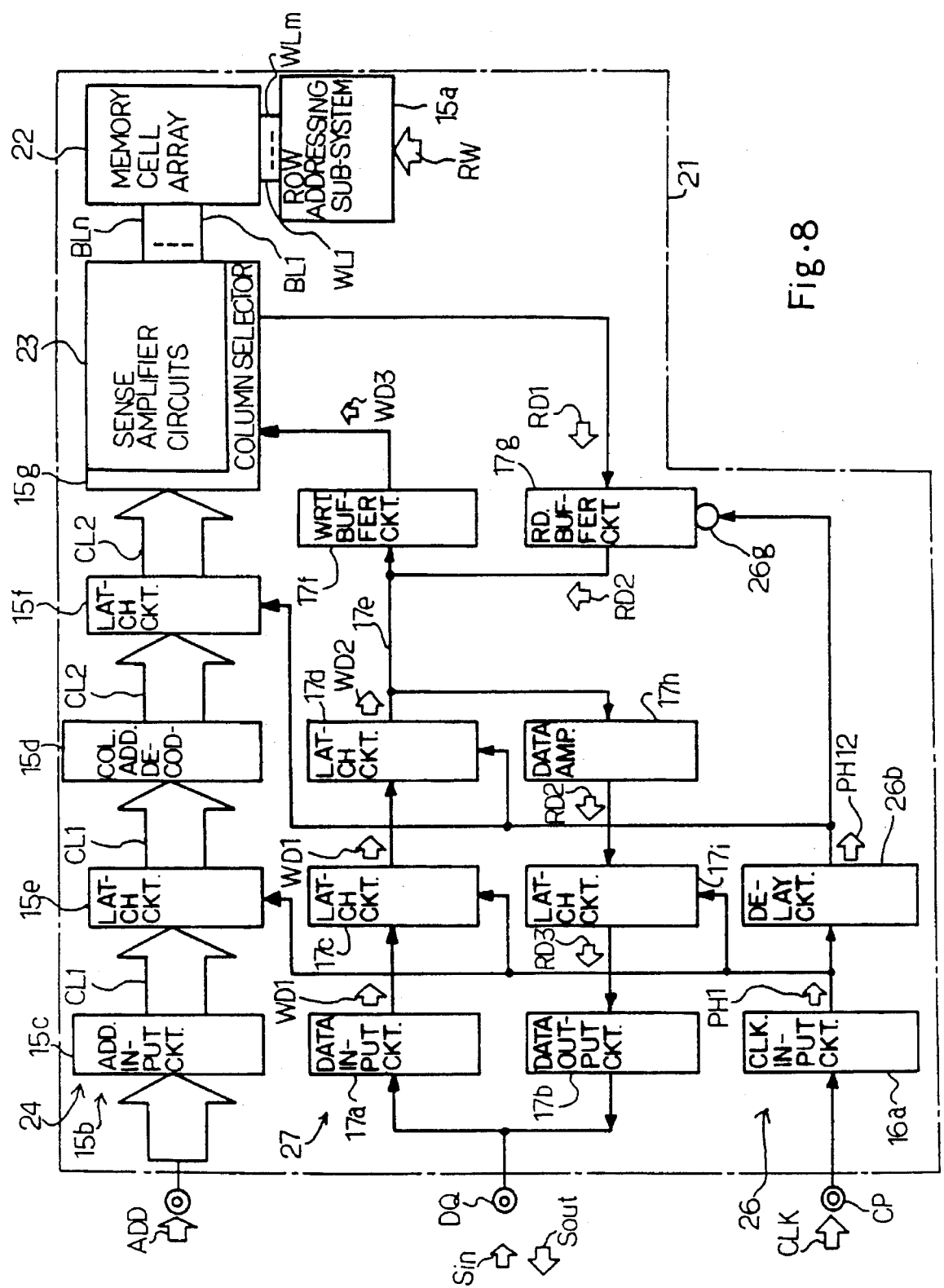
FIG. 8 is a block diagram showing the arrangement of another semiconductor pipeline memory device according to the present invention.

Turning to FIG. 8 of the drawings, another semiconductor pipeline memory device embodying the present invention is fabricated on a semiconductor chip 21, and largely comprises a memory cell array 22, sense amplifier circuits 23, an addressing system 24, a controller 26 and a pipeline data propagation system 27. However, the memory cell array 22, the sense amplifier circuits 23, the addressing system 24 and the pipeline data propagation system 27 are similar to those of the first embodiment, and components thereof are labelled with the same references designating the corresponding components of the first embodiment.

Figure 9:
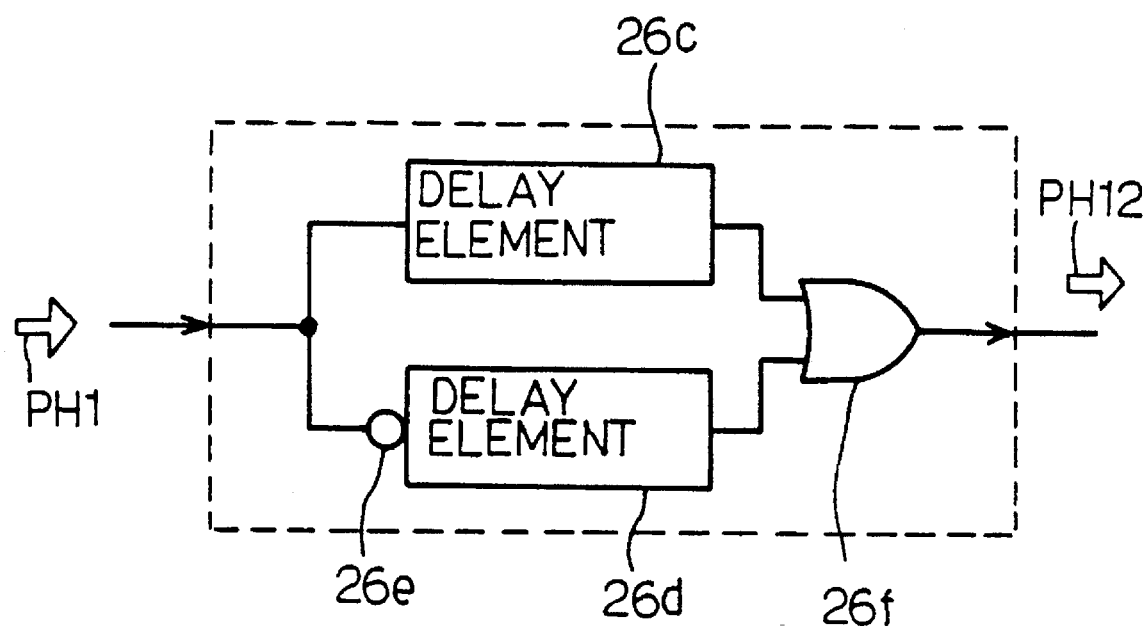
FIG. 9 is a circuit diagram showing the arrangement of a delay circuit incorporated with the semiconductor pipeline memory device shown in FIG. 8.

The controller 26 also includes the clock input circuit 16a and a delay circuit 26b, and the circuit arrangement of the delay circuit 26b is illustrated in FIG. 9 in detail.

The delay circuit 26b has delay elements 26c and 26d, an inverter 26e coupled to an input node of the delay element 26d, an OR gate 26f coupled to the output nodes of the delay elements 26c and 26d and an inverter 26g coupled to the read buffer circuit 17g (see FIG. 8). The delay elements 26c and 26d introduce respective time delays into the first timing clock PH1, and the time delays are regulable by changing wiring arrangements of the delay elements 26c and 26d in a later stage of the fabrication process.

The OR gate supplies a second timing clock signal PH12 to the latch circuits 15f and 17d, and the inverter 26g supplies the inverted second timing clock signal or a third clock signal to the read buffer circuit 17g.

The semiconductor pipeline memory device thus arranged behaves in the read-out phase as shown in FIG. 10. When the second timing clock signal PH12 decays at times t11, t14, t17 and t20, the inverter 26g raises the third timing clock signal. For this reason, the pipeline read-out operation is similar to that of the first embodiment, and description is omitted for avoiding repetition.

Although particular embodiments of the present invention have been shown and described, it will be obvious to those skilled in the art that various changes and modifications may be made without departing from the spirit and scope of the present invention. For example, the pipeline read-write system may be multiplied for a multi-bit input/output data signals.

What is claimed is:

1. A semiconductor pipeline memory device comprising:

a plurality of addressable memory cells for storing data bits, respectively;

a plurality of data propagation paths selectively coupled to said plurality of addressable memory cells;

an addressing system responsive to an external address signal supplied to an address port so as to make said plurality of addressable memory cells selectively accessible;

a data propagation system coupled between said plurality of data propagation paths and a data port; and a pipeline controlling system causing said addressing system and said data propagation system to trace a pipeline sequence from an address input to a data supply, and producing at least a first timing clock signal changed to a first active level in each of pipeline cycles, a second timing clock signal changed to a second active level after said first timing clock signal in said each of said pipeline cycles and a third timing clock signal changed to a third active level between said first timing clock signal and said second timing clock signal in said each of said pipeline cycles, said pipeline sequence including a first pipeline stage close to said address port and having first temporary storage means responsive to said first timing clock signal so as to achieve a first task in a first time interval between said first timing clock signal in each of said pipeline cycles and said second timing clock signal in said each of said pipeline cycles, a second pipeline stage contiguous to said first pipeline stage and having second temporary storage mean's responsive to said second and third timing clock signals so as to achieve a second task in a second time interval between said second timing clock signal in each of said pipeline cycles and said third timing clock signal in the next pipeline cycle, and a third pipeline stage contiguous to said second pipeline stage and having third temporary storage means and responsive to said first timing clock signal so as to achieve a third task in a third time interval between said third timing clock signal in each of said pipeline cycles and said first timing clock signal in the next pipeline cycle.

2. The semiconductor pipeline memory device as set forth in claim 1, in which said addressing system includes a row addressing sub-system responsive to an external row address sub-signal so as to electrically couple one of groups of said plurality of addressable memory cells to said plurality of data propagation paths, and a column addressing sub-system having an address input circuit coupled to said address port and producing column address data signals from an external column address sub-signal, first latch circuits coupled to said address input circuit and responsive to said first timing clock signal so as to temporarily store said column address data signals, a column address decoder coupled to said first latch circuits and producing column address decoded signals from said column address data signals stored in said first latch circuits, and second latch circuits coupled to said column address decoder and responsive to said second timing clock signal so as to temporarily store said column address decoded signals, said second latch circuits supplying said column address decoded signals to said data propagation system so as to selectively couple said data propagation system to said plurality of data propagation paths.

3. The semiconductor pipeline memory device as set forth in claim 1, in which said addressing system includes a row addressing sub-system responsive to an external row address sub-signal so as to electrically couple one of groups of said plurality of addressable memory cells to said plurality of data propagation paths, and a column addressing sub-system having an address input circuit coupled to said address port and producing column address data signals from an external column address sub-signal, first latch circuits coupled to said address input circuit and responsive to said first timing clock signal so as to temporarily store said column address data signals, a column address decoder coupled to said first latch circuits and producing column address decoded signals from said column address data signals stored in said first latch circuits, and second latch circuits coupled to said column address decoder and responsive to said second timing clock signal so as to temporarily store said column address decoded signals, said second latch circuits supplying said column address decoded signals to said data propagation system so as to selectively couple said data propagation system to said plurality of data propagation paths, said data propagation system including a pipeline write-in data propagation sub-system coupled to said data port for propagating an input data toward said plurality of data propagation paths, a pipeline read-out data propagation sub-system coupled to said data port in parallel to said pipeline write-in data propagation sub-system for propagating an output data to said data port, and a column selector coupled between said plurality of data propagation paths and said pipeline write-in data propagation sub-system and said pipeline read-out data propagation sub-system and responsive to said column address decoded signals for selectively coupling said plurality of data propagation paths to one of said pipeline write-in data propagation sub-system and said pipeline read-out data propagation sub-system.

4. The semiconductor pipeline memory device as set forth in claim 3, in which said data propagation system further includes a plurality of sense amplifier circuits respectively coupled to said plurality of data propagation paths.

5. The semiconductor pipeline memory device as set forth in claim 3, in which said pipeline read-out data propagation sub-system includes a read buffer circuit coupled to said column selector and responsive to said third timing clock signal so as to temporarily store said output data, a data amplifier coupled to said read buffer circuit for amplifying said output data, a third latch circuit coupled to said data amplifier and responsive to said first timing clock signal so as to temporarily store said output data, and a data output circuit coupled to said third latch circuit and producing an output data signal from said output data, said first latch circuits and said column address decoder forming said first pipeline stage, said second latch circuits, said column selector, said read buffer circuit and said data amplifier forming said second pipeline stage, said third latch circuit and said data output circuit forming said third pipeline stage.

6. The semiconductor pipeline memory device as set forth in claim 3, in which said pipeline write-in data propagation sub-system has a data input circuit coupled to said data port and producing said input data from an input data signal, a third latch circuit coupled to said data input circuit and responsive to said first timing clock signal so as to temporarily store said input data, a fourth latch circuit coupled to said third latch circuit and responsive to said second timing clock signal so as to temporarily store said input data, and a write buffer circuit coupled between said fourth latch circuit and said column selector for transferring said input data to said column selector.

7. The semiconductor pipeline memory device as set forth in claim 1, in which said pipeline controlling system includes a clock input circuit supplied with an external clock signal for producing said first timing clock signal, and a delay circuit introducing a first time delay into said first timing clock signal for producing said second timing clock signal and a second time delay into said first timing clock signal for producing said third timing clock signal.

8. The semiconductor pipeline memory device as set forth in claim 7, in which said first active level is identical with said second active level and said third active level.

9. The semiconductor pipeline memory device as set forth in claim 7, in which said delay circuit includes a first delay sub-circuit introducing said first time delay into said first timing clock signal for producing said second timing clock signal, and a second delay sub-circuit introducing said second time delay into said first timing clock signal for producing said third timing clock signal.

10. The semiconductor pipeline memory device as set forth in claim 7, in which said delay circuit includes first delay sub-circuit coupled to said clock input circuit, a first inverter coupled to said clock input circuit, a second delay sub-circuit coupled to said first inverter, an OR gate coupled to an output node of said first delay sub-circuit and an output node of said second delay sub-circuit and producing said second timing clock signal, and a second inverter coupled to an output node of said OR gate for producing said third timing clock signal.

11. The semiconductor pipeline memory device as set forth in claim 7, in which said first time delay is equal to a first time consumed by a signal propagation through said first pipeline stage, and said second time delay satisfies following equations $$t1+t21=(t1+t2)/2+t_D2$$

$$t22=(t1+t2)/2-t_D2$$

where t1 is said first time, t2 is a second time consumed by a signal propagation through said second pipeline stage, t21 is a third time consumed by a signal propagation from a first sub-means of said second temporary storage means responsive to said second timing clock signal to a second sub-means of said second temporary storage means responsive to said third timing clock signal, $t_D2$ is said second time delay and t22 is a fourth time consumed by a signal propagation from said second sub-means to said third temporary storage means responsive to said first timing clock signal.

* * * * *